United States Patent [19]

Matsubara et al.

[11] Patent Number: 5,122,923

[45] Date of Patent: Jun. 16, 1992

[54] THIN-FILM CAPACITORS AND PROCESS FOR MANUFACTURING THE SAME

[75] Inventors: Shogo Matsubara; Yoichi Miyasaka, both of Tokyo, Japan

[73] Assignee: NEC Corporation, Tokyo, Japan

[21] Appl. No.: 575,368

[22] Filed: Aug. 30, 1990

[30] Foreign Application Priority Data

Aug. 30, 1989 [JP] Japan .................... 1-226030
Mar. 7, 1990 [JP] Japan .................... 2-57059

[51] Int. Cl.⁵ .................... H01G 4/10; H01G 7/00
[52] U.S. Cl. .................... 361/321; 29/25.42
[58] Field of Search .............. 29/25.42; 361/304, 305, 361/306, 311-313, 321; 264/65

[56] References Cited

U.S. PATENT DOCUMENTS

| | | | |
|---|---|---|---|
| 4,903,110 | 2/1990 | Aono | 357/71 |
| 4,981,633 | 1/1991 | Alles et al. | 264/65 |
| 4,982,309 | 1/1991 | Shepherd | 361/321 |

OTHER PUBLICATIONS

I.B.M. Technical Disclosure Bulletin 357-51 Nov. 1974 vol. 17 No. 6 pp. 1569-1570.
I.B.M. Technical Disclosure Bulletin 357-51 Aug. 1980 vol. 23 No. 23 p. 1058.

Primary Examiner—Donald Griffin
Attorney, Agent, or Firm—Burns, Doane, Swecker & Mathis

[57] ABSTRACT

A thin-film capacitor comprises a substrate, a first electrode, of polycrystalline silicon, a second electrode, a dielectric, and a third electrode such as aluminum in the structure stacked in sequence from bottom to top. The second electrode directly on which the dielectric layer is formed is made from a member selected from the group consisting of ruthenium, ruthenium oxide, ruthenium silicide, rhenium, rhenium oxide, rhemium silicide, osmium, osmium oxide, osmium silicide, rhodium, rhodium oxide, rhodium silicide, iridium, iridium oxide and iridium silicide.

18 Claims, 5 Drawing Sheets

THIN-FILM CAPACITORS AND PROCESS FOR MANUFACTURING THE SAME

BACKGROUND OF THE INVENTION

1. Field of the Invention

This invention relates to thin-film capacitors and, more particularly, to those serving as circuit components of ICs and LSIs. This invention further relates to a process of manufacturing these thin-film capacitors.

2. Description of The Related Art

With developing integrated-circuit techniques electronic circuits are becoming more and more miniaturized, and in turn the miniaturization of capacitors essential as circuit components for various electronic circuits has become a more important problem. Active components such as transistors are being miniaturized rapidly whereas miniaturization of thin-film capacitors comprising a dielectric thin-film layer, which are formed to operate together with active components on the same substrate, fall so behind that it is becoming a major inhibiting factor against making in more LSI or VLSI form. This is because of hitherto using, as material for dielectric thin-films, only materials having up to 10 at most in dielectric constant, such as $SiO_2$ and $Si_3N_4$. Therefore it is required for miniaturization of thin-film capacitors to develop dielectric thin-films having great dielectric constants. Of the ferroelectric oxides represented by chemical formula $ABO_3$, perovskite oxides such as $BaTiO_3$, $SrTiO_3$ and $PbZrO_3$, ilmenite oxides such as $LiNbO_3$, or $Bi_4Ti_3O_{12}$ are available not by themselves but also as solid solutions thereof, in the form of a single crystal or ceramic. These oxides are known to have dielectric constants ranging from 100 to as much as 10000, and are widely used for ceramic capacitors. Formation of thin-films from these materials is markedly effective for miniaturization of thin-film capacitors, and approaches to this have been carried out for a considerably long time. Particularly, examples resulting in relatively good characteristics are stated in a paper (Processing of the IEEE Vol. 59(10), 1440–1447) as follows: thin-films of $BaTiO_3$ formed by sputtering and then heat treatment exhibited dielectric constants of 16 (when formed at room temperature) and 1900 (when formed by heat treatment at 1200° C.).

For the formation of the conventional dielectric thin-films such as $BaTiO_3$ mentioned above so as to have high dielectric constants, high temperature treatment is required. Such thin films can not be formed on the surface of the lower electrode, which is a structural element of the thin-film capacitor, unless the lower electrode is made from a noble metal having a high melting point, such as platinum or palladium. If the lower electrode is formed from a general electrode material such as aluminium, nichrome or copper, such electrode material might be subjected at high temperatures to evaporation and interaction with the dielectric film, resulting in a marked drop in the dielectric constant of the dielectric film. Even if made from a high melting point noble metal such as platinum or palladium, the formation of dielectric thin-films at 300° C. or higher temperatures may bring the surface of the electrode into rough texture due to recrystallization. The dielectric film layer formed on such an electrode has nonuniform thickness, and therefore when voltage is applied, the smaller thickness is affected by the stronger electric field. This presents a problem with the dielectric breakdown characteristic.

Electrode material widely used for LSIs or VLSIs at present is a polycrystalline silicon or a low-resistance silicon layer formed by addition of an impurity at a high doping level to a part on a silicon substrate. These electrodes are collectively called "silicon electrodes" hereinafter. Silicon electrodes for which fine processing techniques have already been established are extensively used. Accordingly if a good thin-film of high dielectric constant could be formed on a silicon electrode, such a technique be applied to fabrication of IC capacitors. In the prior art, however, for example, a paper on $SrTiO_3$ (IBM Journal of Research and Development, Nov. 1969, pp. 686–695) states on pages 687–688 that when a thin-film of high dielectric constant material is formed on a silicon electrode, an about 100 Å-thick layer equivalent to silicon dioxide ($SiO_2$) inevitably appears along the interface between them. Owing to its low dielectric constant, this interfacial layer contributes to a remarkable drop of the effective dielectric constant of the high dielectric constant film, and thus to make substantially invalid the advantage of using high dielectric material. Similar results are disclosed in another report of $BaTiO_3$ (Journal on Vacuum Science and Technology Vol. 16(2), 315–318, refer to page 316).

SUMMARY OF THE INVENTION

It therefore is an object of the invention to provide thin-film capacitors made from high dielectric constant material typically such as $BaTiO_3$ or $SrTiO_3$, thereby having high capacity densities and good insulating characteristics, and suitable as a component of silicon ICs.

Another object of the invention is to provide a process of manufacturing the thin-film capacitors according to the invention.

According to one aspect of the present invention, there is obtained a thin-film capacitor comprising a first electrode layer consisting essentially of a member selected from the group consisting of ruthenium, ruthenium oxide, ruthenium silicide, rhenium, rhenium oxide, rhenium silicide, osmium, osmium oxide, osmium silicide, rhodium, rhodium oxide, rhodium silicide, iridium, iridium oxide and iridium silicide, a dielectric layer consisting essentially of an oxide ferroelectric material formed on the first electrode layer, and a second electrode layer formed on the dielectric layer.

According to another aspect of the present invention, there is provided a process of manufacturing thin-film capacitors comprising the steps of forming a dielectric layer consisting essentially of an oxide ferroelectric material on a first electrode layer, the first electrode layer consisting essentially of a member selected from the group consisting of ruthenium, ruthenium oxide, ruthenium silicide, rhenium, rhenium oxide, rhenium silicide, osmium, osmium oxide, osmium silicide, rhodium, rhodium oxide, rhodium silicide, iridium, iridium oxide and iridium silicide, and forming a second electrode layer on the dielectric layer.

Suitable oxide ferroelectrics for use in the present invention are perovskite oxides, ilmenite oxides, and $Bi_4Ti_3O_{12}$. Preferred examples of perovskite oxides are $BaTiO_3$, $SrTiO_3$, $PbTiO_3$, $PbZrO_3$ and solid solutions thereof. Preferred examples of ilmenite oxides are $LiNbO_3$, $LiTiO_3$ and solid solutions thereof.

As the second electrode, aluminum is preferably used.

A third electrode layer made of polycrystalline silicon may be provided under the first electrode layer.

An advantage of the present invention is that thin-film capacitors can be provided having a high dielectric constant and a good insulating characteristic by making the first electrode layer of the thin-film capacitor from ruthenium, etc. never subjected to surface-roughnening by high temperature treatment. Another advantage of the present invention is that a thin-film capacitor having a uniform high dielectric constant independent of the thickness of the dielectric layer can be fabricated on a silicon substrate by virtue of the fact that unlike conventional silicon electrodes, no silicon oxide layer of low dielectric constant is formed along the interface with the dielectric layer.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Example 1

Figure 1:
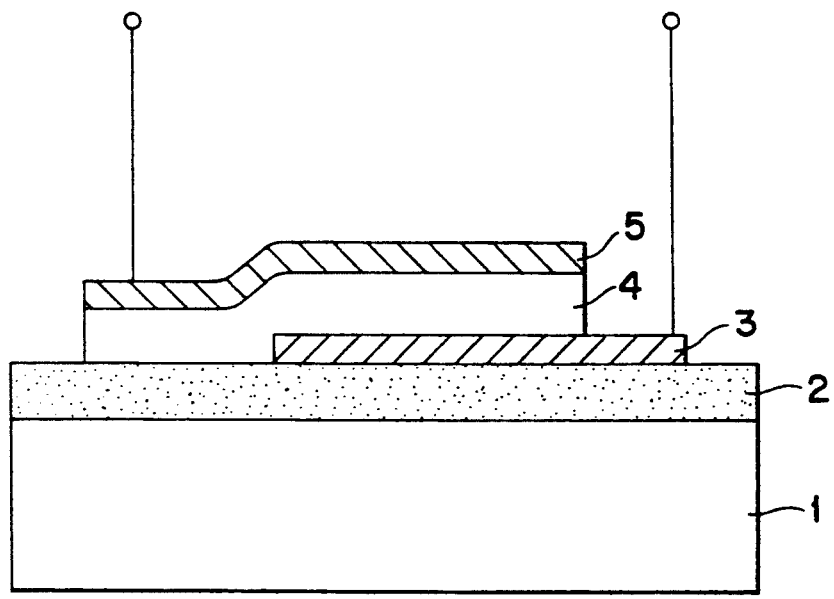
FIG. 1 is a sectional view of a thin-film capacitor illustrating the first and second embodiments (Examples 1 and 2) of the present invention.

Referring to FIG. 1 which illustrates the structure of the thin-film capacitor formed in the first embodiment of the present invention, a silicon substrate 1, an insulating silicon oxide layer 2, a lower electrode 3, a dielectric layer 4 of $BaTiO_3$, and an upper electrode 5 of aluminum layer are stacked in sequence from bottom to top.

In the first processing step, silicon oxide layer 2 of 1 $\mu$m thickness was formed on the surface of a single crystal of silicon by the wet oxidation technique. The thermal oxidation was carried out at 1100° C. in an atmosphere wherein the flow rate ratio of oxygen gas to hydrogen gas was kept 1 to 1. Lower electrode layer 3 of 0.5 $\mu$m thickness was formed by the DC magnetron sputtering technique using a target of sintered Ru or $RuSi_2$ under the conditions: atmosphere of Ar gas or a mixed gas of Ar and $O_2$, $4 \times 10^{-3}$ Torr, and substrate temperature 100° C. The $BaTiO_3$ layer 4 of 0.5 $\mu$m thickness was constructed at a substrate temperature of 600° C. at $1 \times 10^{-2}$ Torr in an Ar-$O_2$ mixture gas, using a powder target of stoichiometric composition, by the high-frequency magnetron sputtering technique. Upper Al-electrode 3 of 0.5 $\mu$m thickness was formed by the DC sputtering technique. This capacitor has an effective area amounting to $3 \times 5$ mm$^2$.

Figure 2A:
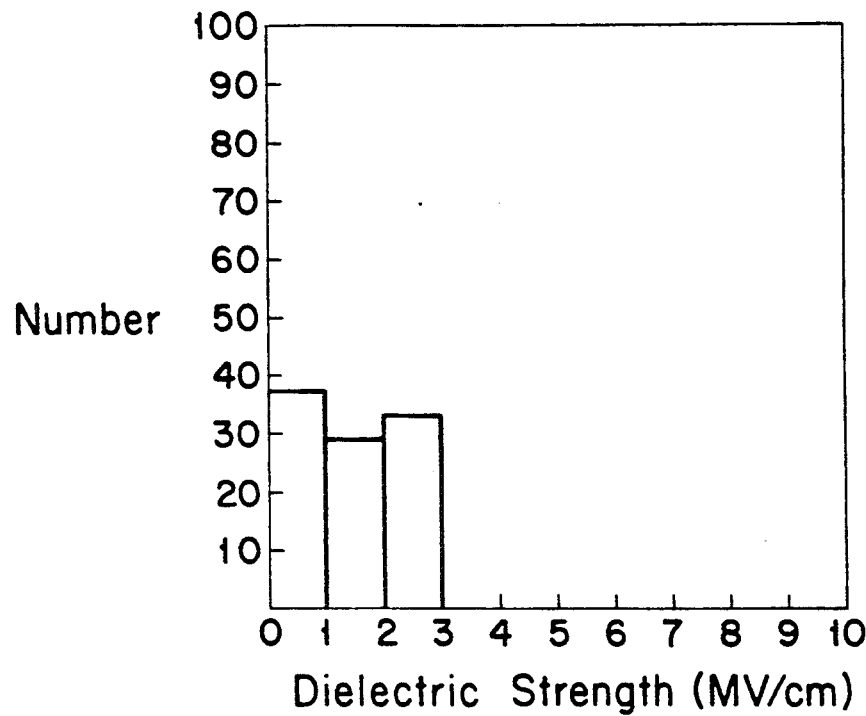
FIGS. 2(a) and 2(b) and FIGS. 3(a) and 3(b) are histograms of dielectric strength from the results of Examples 1 and 2, respectively.
Figure 2B:
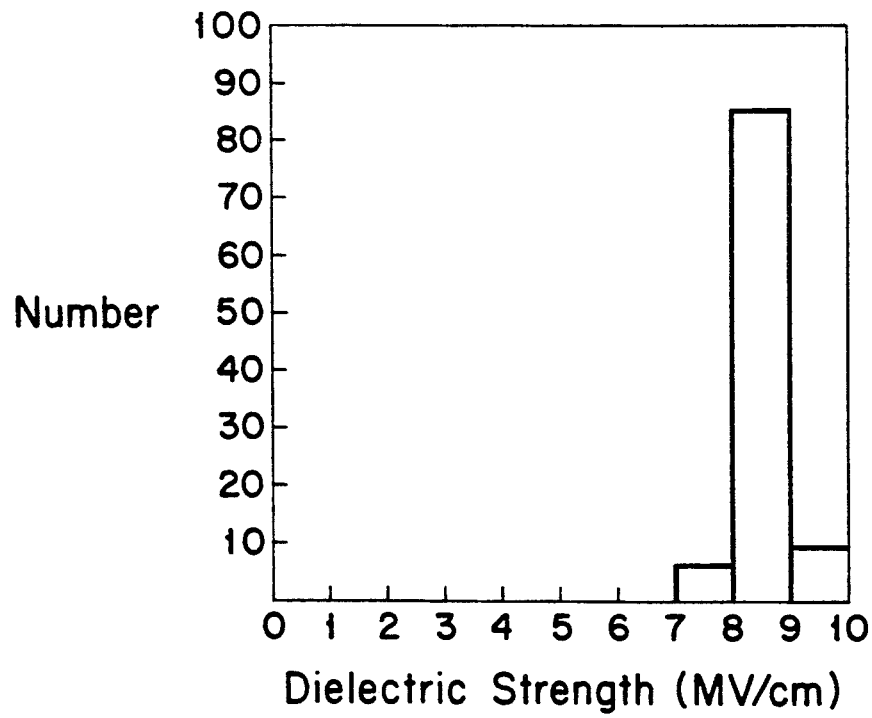

Next will be described the differences in characteristics of the $BaTiO_3$ layer between, as lower electrode 3, a layer of palladium, a high melting point metal, and layers formed according to the present invention. FIG. 2(a) shows a histogram of dielectric strength of the $BaTiO_3$ layer using a layer formed according to the present invention as the lower electrode, and FIG. 2(b) gives that using a Pd layer having a thickness of 0.5 $\mu$m Herein "dielectric strength" is defined as "electric field strength when current reaching $1 \times 10^{-4}$ A/cm$^2$". FIGS. 2a–b demonstrate that this example has a great insulating characteristic: as much as approximately 3 times in dielectric breakdown strength, and no dispersion in distribution. After removing a part of the $BaTiO_3$ layer by etching, the surface roughness of lower electrode 3 was measured with a needle-type surface roughness tester with the results: average values (Ras) were 50 Å for the ruthenium, or the like, layer and 380 Å for the Pd layer. Thus the ruthenium, or the like, layer proved to be better. Besides the surface or roughness of lower electrode 3 was about 30 Å, respectively, as measured each before forming the $BaTiO_3$. These results suggest that the difference in insulating characteristic between both may be attributed to surface roughness of lower electrode 3 induced by the high temperature treatment for forming the $BaTiO_3$ layer. Layers of ruthenium, ruthenium oxide, ruthenium silicide and stacked structures consisting of these materials gave similar effects as lower electrode 3.

Example 2

Again referring to FIG. 1, a silicon substrate 1, an insulating silicon oxide layer 2, a lower electrode 3, a dielectric layer 4 of $BaTiO_3$, and an upper electrode 5 of an aluminum layer are stacked in sequence from bottom to top.

In the first processing step, silicon oxide layer 2 of 1 $\mu$m thickness was formed on the surface of a single crystal of silicon by the wet oxidation technique. The terminal oxidation was carried out at 1100° C. in an atmosphere wherein the flow rate ratio of oxygen gas to hydrogen gas was kept 1 to 1. Lower electrode layer 3 of 0.5 $\mu$m thickness was formed by the DC magnetron sputtering technique using a target of sintered Re or $ReSi_2$ under the conditions: atmosphere of Ar gas or a mixed gas of Ar and $O_2$, $4 \times 10^{-3}$ Torr, and substrate temperature 100° C. The $BaTiO_3$ layer 4 of 0.5 $\mu$m thickness was constructed at a substrate temperature of 600° C. at $1 \times 10^{-2}$ Torr in an Ar-$O_2$ mixture gas, using a powder target of stoichiometric composition, by the high-frequency magnetron sputtering technique. Upper Al-electrode 3 of 0.5 $\mu$m thickness was formed by the DC sputtering technique. This capacitor has an effective area amounting to $3 \times 5$ mm$^2$.

Figure 3A:
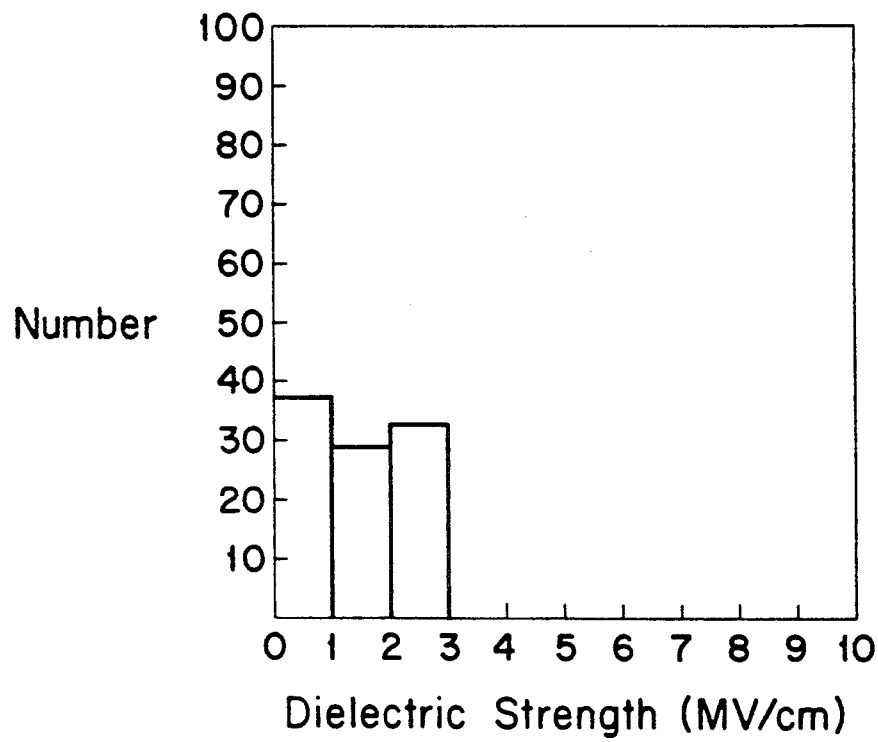
Figure 3B:
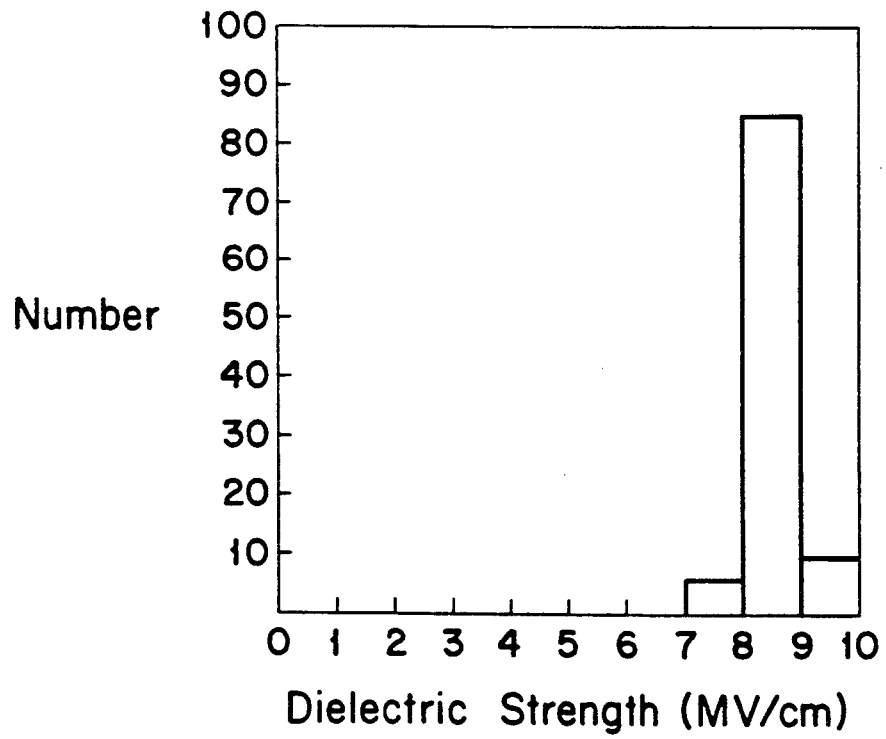

Next will be described the differences in characteristics of the $BaTiO_3$ layer between, as lower electrode 3, a layer of palladium, a high melting point metal, and layers formed according to the present invention. FIG. 3(a) shows a histogram of dielectric strength of the $BaTiO_3$ layer using a layer formed according to the present invention as the lower electrode, and FIG. 3(b) gives that using a Pd layer having a thickness of 0.5 $\mu$m. Herein "dielectric strength" is defined as "electric field strength when current reaching $1 \times 10^{-4}$ A/cm$^2$". It demonstrates this Example has a great insulating characteristic: as much as approximately 3 or more times in dielectric breakdown strength, and no dispersion in distribution.

After removing a part of the $BaTiO_3$ layer by etching, the surface roughness of lower electrode 3 was measured with a needle-type surface roughness tester with the results: average values (Ras) were 50 Å for the rhenium, or the like, layer and 380 Å for the Pd layer. Thus, the rhenium, or the like, layer proved to be better. Besides the surface or roughness of lower electrode 3 was about 30 Å, respectively, as measured each before forming the BaTiO$_3$. These results suggest that the difference in insulating characteristic between both may be attributed to surface roughness of lower electrode 3 induced by the high temperature treatment for forming the BaTiO$_3$ layer. Layers of rhenium, rhenium oxide, rhenium silicide and stacked structures consisting of these materials gave similar effects as lower electrode 3.

Moreover in place of rhenium, rhenium oxide and rhenium silicide can be used osmium, rhodium, iridium and silicides or oxides thereof as material of the lower electrode layer with good results in dielectric strength of the BaTiO$_3$ layer as much as 3 times or more than the conventional Pd lower electrode layer. Table 1 summarizes various materials and respective dielectric strengths of the BaTiO$_3$ layer formed on the lower electrode made from each material.

TABLE 1

| Lower electrode | Pd | Re | ReSi$_2$ | ReO$_3$ | Os | OsSi$_2$ | OsO$_2$ |
|---|---|---|---|---|---|---|---|
| Dielectric strength MV/cm | 2.1 | 9.0 | 8.4 | 8.6 | 7.9 | 8.1 | 7.7 |

| Lower electrode | | Rh | RhSi$_2$ | RhO$_2$ | Ir | IrSi$_2$ | IrO$_2$ |
|---|---|---|---|---|---|---|---|
| Dielectric strength MV/cm | | 7.9 | 8.0 | 8.1 | 7.6 | 7.6 | 7.3 |

Example 3

Figure 4:
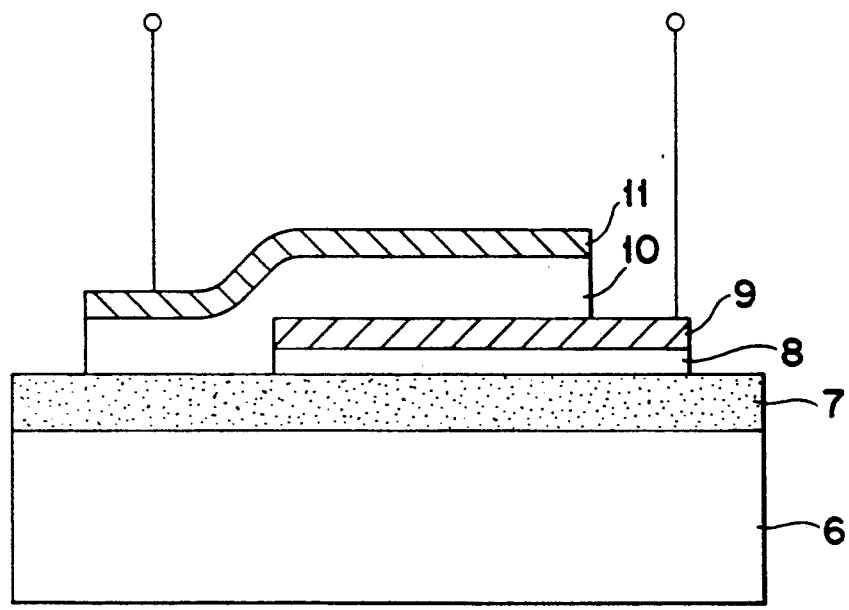
FIG. 4 is a sectional view of another thin-film capacitor illustrating the third and fourth embodiments (Examples 3 and 4) of the present invention.

Referring to FIG. 4 which illustrates the structure of the thin-film capacitor to be formed, a single-crystal silicon substrate 6, an insulating silicon oxide layer 7, a lower electrode 8 consisting of a polycrystalline silicon layer and a layer 9 as of ruthenium, a dielectric layer 10 of an BaTiO$_3$, and an upper electrode 11 of aluminum layer are stacked in sequence from bottom to top.

The polycrystalline silicon layer 8 of 0.3 μm thickness was constructed at 300° C. by plasma CVD technique. Into this polycrystalline silicon layer 8, arsenic ions were injected at a dose of $2 \times 10^{16}$ cm$^{-2}$ and an acceleration voltage of 70 kV, and heat-treated at 900° C. for 20 minutes to obtain sheet resistance of about 100 Ω/□. The other layers were formed in the same way as described in Example 1.

In this case, the polycrystalline silicon layer 8 serves for the improvement of the adhesion characteristic between the silicon oxide insulating layer 7 and the lower electrode. The formation of the layer 9 as of ruthenium on the polycrystalline silicon layer allowed fabrication of a thin-film capacitor having an insulating characteristic as good as in Example 1.

EXAMPLE 4

Again referring to FIG. 4 which illustrates the structure of the thin-film capacitor to be formed, a single-crystal silicon substrate 6, an insulating silicon oxide layer 7, a lower electrode 8 consisting of a polycrystalline silicon layer and a layer 9 as of rhenium, a dielectric layer 10 of BaTiO$_3$, and an upper electrode 11 of aluminum layer are stacked in sequence from bottom to top.

The polycrystalline silicon layer 8 of 0.3 μm thickness was constructed at 300° C. by plasma CVD technique. Into this polycrystalline silicon layer 8, arsenic ions were injected at a dose of $2 \times 10^{16}$ cm$^{-2}$ and an acceleration voltage of 70 kV, and heat-treated at 900° C. for 20 minutes to obtain sheet resistance of about 100 Ω/□. The other layers were formed in the same way as described in Example 2.

In this case, the polycrystalline silicon layer 8 serves for the improvement of the adhesion characteristic between the silicon oxide insulating layer 7 and the lower electrode. The formation of the layer 9 as of rhenium on the polycrystalline silicon layer allowed fabrication of a thin-film capacitor having an insulating characteristic as good as in Example 2.

Example 5

Figure 5:
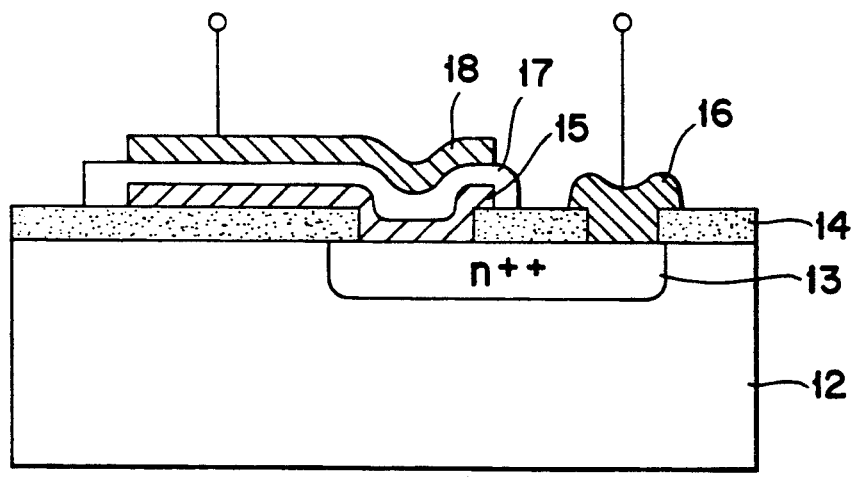
FIG. 5 is a sectional view of a further thin-film capacitor illustrating the fifth embodiment (Example 5) of the present invention.

Referring to FIG. 5, the structure of the thin-film capacitor to be formed comprises a single crystal silicon substrate 12 with thereon a low resistance region 13 formed by doping phosphorus at a low level, and a silicon oxide layer 14 as an insulating interlayer formed on the surface of the substrate and provided with two contact holes of which one is filled as with ruthenium to make a part of a lower electrode layer 15 and the other with aluminum layer 16 to form a terminal connecting to the lower electrode 15 through the low resistance region 13. The lower electrode layer 15 may be formed to fill the contact hole and overlap the silicon oxide layer 14. The structure further comprises a BaTiO$_3$ layer 17 on the lower electrode layer, and an upper Al electrode 18 on the BaTiO$_3$ layer 17.

In this Example, for permitting the connection through the low resistance region 13, the lower electrode layer is formed on a single crystal silicon, and the thus-constructed thin-film capacitor has proved to have a dielectric characteristic as good as in Example 1.

Example 6

Figure 6:
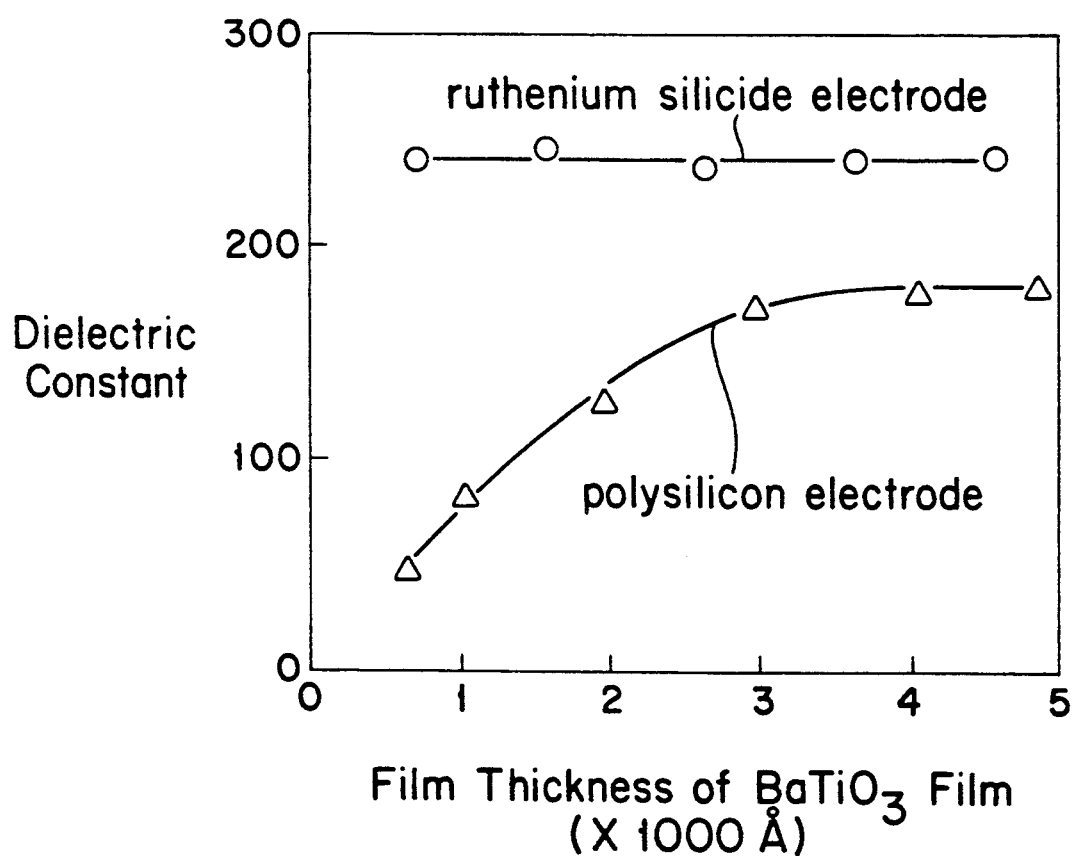
FIG. 6 is a graph of the fifth embodiment (Example 6) according to the present invention which shows the relationship between dielectric constant and layer thickness.

In the following will be described differences between the dielectric constant of the BaTiO$_3$ layer with the polycrystalline silicon layer as the lower electrode, and that with a layer according to the invention. At present polycrystalline silicon film is generally used as electrode layers on silicon LSIs. FIG. 6 shows graphs representing the relationship of the BaTiO$_3$ layer between dielectric constant and thickness, plotting the results when the lower electrode is a ruthenium silicide layer according to the present invention and a polycrystalline silicon layer, respectively. It reveals that the dielectric constant of the BATiO$_3$ layer is constant at about 240 regardless of the thickness thereof, that is, thickness-independent with the layer according to the present invention whereas with the polycrystalline silicon layer, the dielectric constant thereof is thickness-dependent and becomes smaller as the thickness decreases. This suggests, as described earlier, that a silicon oxide layer having a low dielectric constant may be formed along the interface between the BaTiO$_3$ layer and the polycrystalline silicon, bringing about reduction of the effective dielectric constant of the BaTiO$_3$.

As in Examples 3 and 4, the lower electrode may be formed into a double-layer structure consisting of a layer as of ruthenium or rhenium and another layer of polycrystalline silicon thereunder. In this structure, the polycrystalline silicon layer produces effect of improving the adhesion of the layer as of ruthenium or rhenium to the single crystal silicon substrate and to the silicon oxide region. Also, taking into consideration that planarization techniques for filling contact holes with polycrystalline silicon film has been established, the advantage of using it as part of the lower electrode is great.

Finally, formation of the lower electrode as a layer consisting of at least one selected from the group consisting of ruthenium, rhenium, osmium, rhodium, iridium, and silicides and oxides thereof, as in this Example affords an advantage of fabricating a thin-film capacitor having a high fixed dielectric constant independently of the thickness of the dielectric layer on a silicon substrate.

While the invention has been described with reference to the foregoing embodiments, various changes and modifications can be made thereto which fall within the scope of the appended claims.

What is claimed is:

1. A thin-film capacitor comprising:
   a first electrode layer consisting essentially of polycrystalline silicon;
   a second electrode layer formed on the first electrode layer, the second electrode layer consisting essentially of a member selected from the group consisting of ruthenium, ruthenium oxide, ruthenium silicide, rhenium, rhenium oxide, rhenium silicide, osmium, osmium oxide, osmium silicide, rhodium, rhodium oxide, rhodium silicide, iridium, iridium oxide and iridium silicide;
   a dielectric layer consisting essentially of an oxide ferroelectric material formed on said second electrode layer; and
   a third electrode layer formed on said dielectric layer.

2. A thin-film capacitor as recited in claim 1, wherein said oxide ferroelectric is a member selected from the group consisting of perovskite type oxides, ilmenite oxides and $Bi_4Ti_3O_{12}$.

3. A thin-film capacitor as recited in claim 1, wherein said oxide ferroelectric is a member selected from the group consisting of $BaTiO_3$, $SrTiO_3$, $PbTiO_3$, $PbZrO_3$ and solid solutions thereof.

4. A thin-film capacitor as recited in claim 1, wherein a silicon dioxide layer is not present between said dielectric layer and the second electrode layer.

5. A thin-film capacitor as recited in claim 1, wherein said dielectric layer has a dielectric constant which is independent of thickness of the dielectric layer.

6. A thin-film capacitor as recited in claim 1, further comprising a substrate, one surface of the first electrode layer being in contact with the substrate and an opposite surface of the first electrode layer being in contact with one surface of the second electrode layer.

7. A thin-film capacitor as recited in claim 6, wherein the substrate comprises silicon dioxide.

8. A thin-film capacitor as recited in claim 1, wherein the second electrode has a surface roughness of no greater than about 50 Å.

9. A thin-film capacitor as recited in claim 1, wherein the third electrode layer consists of a layer of aluminum.

10. A thin-film capacitor as recited in claim 9, wherein one surface of the aluminum layer is in contact with one surface of the dielectric layer.

11. A thin-film capacitor as recited in claim 1, wherein the first electrode layer consists essentially of doped polycrystalline silicon.

12. A thin-film capacitor as recited in claim 11, wherein the first electrode layer is doped with arsenic.

13. A thin-film capacitor as recited in claim 11, wherein the first electrode layer is doped with phosphorous.

14. A thin-film capacitor as recited in claim 1, wherein the second electrode consists essentially of the rhenium, rhenium oxide or rhenium silicide.

15. A thin-film capacitor as recited in claim 1, wherein the second electrode consists essentially of the ruthenium silicide, rhenium silicide, osmium silicide, rhodium silicide or iridium silicide.

16. A process of manufacturing thin-film capacitors comprising the steps of:
    forming a first electrode layer consisting essentially of polycrystalline silicon;
    forming a second electrode layer on the first electrode layer, the second electrode layer consisting essentially of a member selected from the group consisting of ruthenium, ruthenium oxide, ruthenium silicide, rhenium, rhenium oxide, rhenium silicide, osmium, osmium oxide, osmium silicide, rhodium, rhodium oxide, rhodium silicide, iridium, iridium oxide and iridium silicide;
    forming a dielectric layer consisting essentially of an oxide ferroelectric on the second electrode layer; and
    forming a third electrode layer on said dielectric layer.

17. A process of manufacturing a thin-film capacitor as recited in claim 16, wherein said oxide ferroelectric is a member selected from the group consisting of perovskite oxides, ilmenite oxides, and $Bi_4Ti_3O_{12}$.

18. A process of fabricating a thin-film capacitor as recited in claim 16, wherein said oxide ferroelectric is a member selected from the group consisting of $BaTiO_3$, $SrTiO_3$, $PbTiO_3$, $PbZrO_3$ and solid solutions thereof.

* * * * *